United States Patent
Kim et al.

(10) Patent No.: US 9,570,708 B2
(45) Date of Patent: Feb. 14, 2017

(54) ORGANIC LIGHT EMITTING DISPLAY

(71) Applicant: LG DISPLAY CO., LTD., Seoul (KR)

(72) Inventors: Kyungman Kim, Goyang-si (KR); Myungseop Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/330,924

(22) Filed: Jul. 14, 2014

(65) Prior Publication Data

US 2015/0028307 A1  Jan. 29, 2015

(30) Foreign Application Priority Data

Jul. 29, 2013 (KR) .................. 10-2013-0089590

(51) Int. Cl.
  *H01L 51/52* (2006.01)
  *H01L 51/56* (2006.01)
  *H01L 27/32* (2006.01)

(52) U.S. Cl.
  CPC ......... *H01L 51/5259* (2013.01); *H01L 51/525* (2013.01); *H01L 51/5246* (2013.01); *H01L 51/5253* (2013.01); *H01L 51/5256* (2013.01); *H01L 51/56* (2013.01); *H01L 27/3244* (2013.01)

(58) Field of Classification Search
  CPC ............. H01L 51/5246; H01L 51/5259; H01L 23/564; H01L 51/524; H01L 51/525; H01L 51/5253; H01L 51/5256
  See application file for complete search history.

(56) References Cited

U.S. PATENT DOCUMENTS

| | | | |
|---|---|---|---|
| 2004/0004434 A1* | 1/2004 | Nishi | H01L 27/322 313/506 |
| 2005/0046346 A1* | 3/2005 | Tsuchiya | H01L 27/3244 313/509 |
| 2005/0248270 A1* | 11/2005 | Ghosh et al. | 313/512 |
| 2006/0061269 A1* | 3/2006 | Tsuchiya | H01L 27/3276 313/506 |
| 2007/0172971 A1* | 7/2007 | Boroson | 438/26 |
| 2007/0285007 A1* | 12/2007 | Lee et al. | 313/504 |
| 2013/0240862 A1 | 9/2013 | Yoo et al. | |

FOREIGN PATENT DOCUMENTS

| | | |
|---|---|---|
| CN | 1819300 A | 8/2006 |
| CN | 101090592 A | 12/2007 |
| CN | 102651458 A | 8/2012 |
| KR | 10-2013-0055544 A | 5/2013 |
| KR | 10-2013-0058711 A | 8/2013 |
| TW | 200607383 A | 2/2006 |

* cited by examiner

*Primary Examiner* — Yu Chen
(74) *Attorney, Agent, or Firm* — Birch, Stewart, Kolasch & Birch, LLP (57) ABSTRACT

An organic light emitting display including a back plane including an active area on which an image is displayed, and a bezel area outside the active area; a pixel array on the active area and configured to display the image; an encapsulation plate encapsulating the pixel array; a transparent adhesive film free of a moisture absorption filler, formed on the active area and disposed between the encapsulation plate and the back plane; and a dam including a sealant with a moisture absorption filler formed in the bezel area and adjoining the adhesive layer so as to limit moisture from penetrating into the pixel array.

14 Claims, 10 Drawing Sheets

FIG. 1

(RELATED ART)

FIG. 2

(RELATED ART)

FIG. 3

(RELATED ART)

ORGANIC LIGHT EMITTING DISPLAY

This application claims the benefit of Korean Patent Application No. 10-2013-0089590 filed on Jul. 29, 2013, the entire contents of which is incorporated herein by reference for all purposes as if fully set forth herein.

BACKGROUND OF TUE INVENTION

Field of the Invention

Embodiments of the invention relate to an organic light emitting display encapsulation technology.

Discussion of the Related Art

Figure 1:
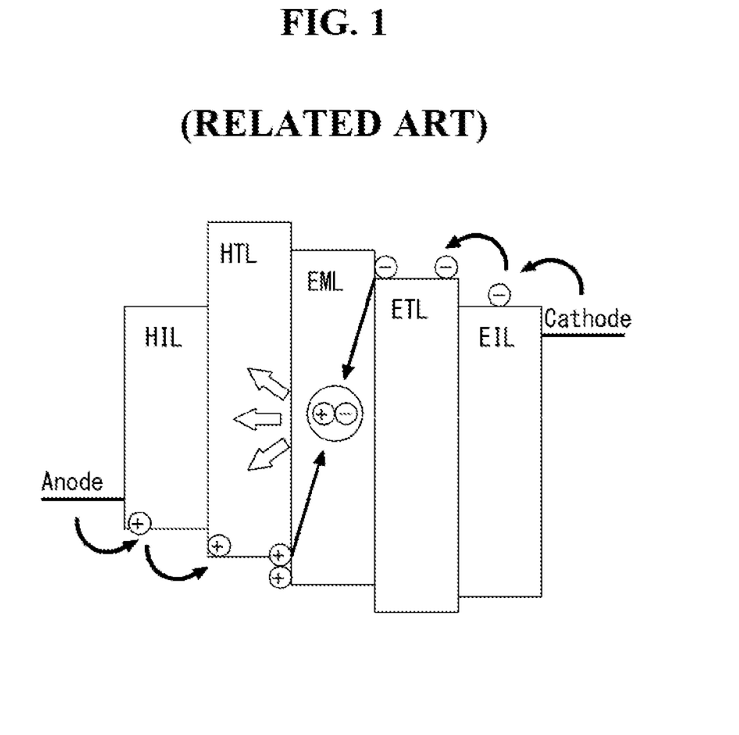
FIG. 1 is an overview illustrating a structure and an emission principle of an OLED.

Each pixel in an organic light emitting display includes an organic light emitting diode (OLED) having a self-emitting structure. As shown in FIG. 1, the OLED includes a stack of organic compound layers including a hole injection layer HIL, a hole transport layer HTL, an emission layer EML, an electron transport layer ETL, an electron injection layer EIL, etc., between an anode and a cathode. The organic light emitting display displays an image using a phenomenon, in which the OLED emits light when electrons and holes are combined in an organic layer through a current flowing in a fluorescence or phosphorescence organic thin film.

In addition, the organic light emitting display may be variously classified depending on kinds of emission materials, an emission method, an emission structure, a driving method, etc. The organic light emitting display may be classified into a fluorescent emission type and a phosphorescent emission type depending on the emission method. Further, the organic light emitting display may be classified into a top emission type and a bottom emission type depending on the emission structure. Further, the organic light emitting display may be classified into a passive matrix OLED type and an active matrix OLED type depending on the driving method.

However, characteristics of the organic compounds are sharply degraded when organic compounds of the OLED are exposed to moisture. Thus, the moisture penetrating into the pixels decreases the reliability and lifespan of the organic light emitting display. An encapsulation method is used to limit the degradation of the OLEDs resulting from the penetration of moisture and oxygen. One example of the encapsulation technology is disclosed in Korean Patent Laid-open Publication Nos. 10-2013-0055544 (May 28, 2013) and 10-2013-0058711 (Jun. 4, 2013) corresponding to the present applicant, and which are hereby incorporated by reference in their entirety.

Figure 2:
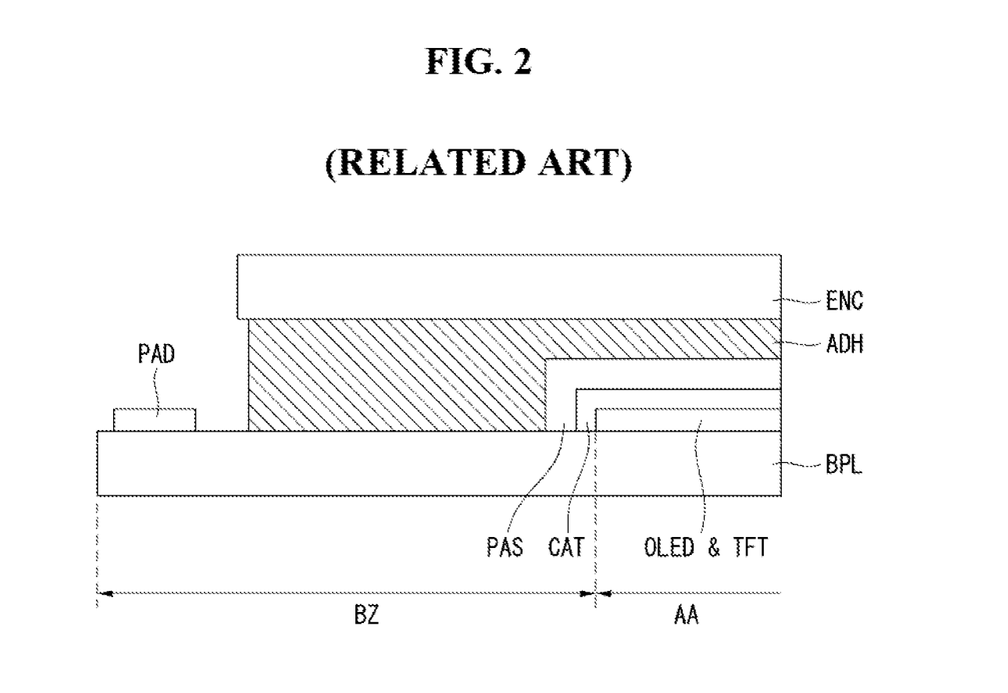
FIGS. 2 and 3 are cross-sectional views illustrating a related art encapsulation technology.

In more detail, an encapsulation technology illustrated in FIG. 2 attaches a back plane BPL and an encapsulation plate ENC using an adhesive film ADH. The back plane BPL includes a pixel array OLED & TFT formed on a substrate. The pixel array OLED & TFT includes data lines, scan lines crossing the data lines, and pixels each including an OLED and a thin film transistor (TFT). The pixels are also arranged in a matrix form.

Further, the pixel array OLED & TFT are covered with a passivation layer PAS and are formed in an active area AA, on which an image is displayed. In FIG. 2, "PAD" denotes a data pad or a scan pad connected to an output terminal of a drive integrated circuit (IC) formed at an end of the data line or the scan line; "BZ" denotes a bezel on which the image is not displayed at an edge of a display panel; and "CAT" denotes a cathode of the OLED. In the encapsulation technology illustrated in FIG. 2, there is no barrier capable of blocking moisture ($H_2O$) penetrating into the pixel array OLED & TFT. Thus, the reliability and the lifespan of the organic light emitting display adopting the encapsulation technology illustrated in FIG. 2 is reduced.

Figure 3:
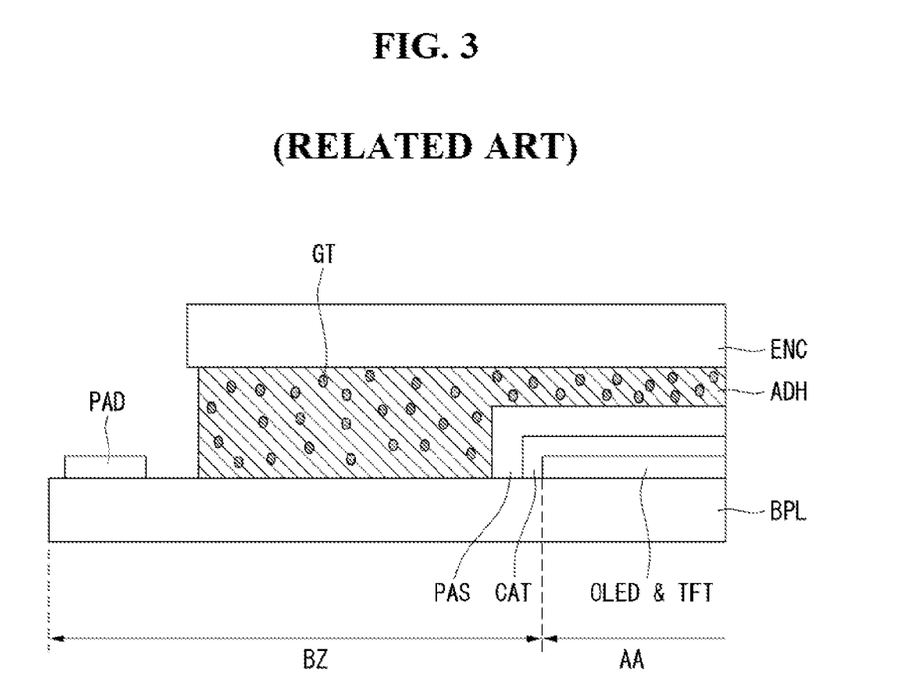

Another encapsulation technology is illustrated in FIG. 3 and includes a back plane BPL and an encapsulation plate ENC attached using an adhesive film ADH. Moisture absorption fillers GT are also added to the inside of the adhesive film ADH to help absorb and prevent the moisture from penetrating or exposing the pixel array OLED & TFT.

However, even though the moisture absorption fillers GT may increase the reliability and the lifespan of the organic light emitting display, the fillers GT are also distributed in the active area AA in FIG. 3. Thus, light emitted from the active area AA is scattered by the moisture absorption fillers GT, and the display image is blurred due to a haze effect. Therefore, it is difficult to apply the encapsulation technology illustrated in FIG. 3 to the top emission type organic light emitting display, in which light of the display image is emitted through the encapsulation plate ENC.

SUMMARY OF THE INVENTION

Accordingly, an object of the present invention is to address the above-noted and other problems.

Another object of the present invention is to provide a novel encapsulation method for an organic light emitting display that decreases the amount of moisture penetrating into the OLED & TFT.

Yet another object of the present invention is to provide a novel encapsulation method for an organic light emitting display that increases the reliability and the lifespan of the organic light emitting display.

To achieve these and other advantages and in accordance with the purpose of the present invention, as embodied and broadly described herein, the present invention provides in one aspect an organic light emitting display including a back plane including an active area on which an image is displayed, and a bezel area outside the active area; a pixel array on the active area and configured to display the image; an encapsulation plate encapsulating the pixel array; a transparent adhesive film free of a moisture absorption filler, formed on the active area and disposed between the encapsulation plate and the back plane; and a dam including a sealant with a moisture absorption filler formed in the bezel area and adjoining the adhesive layer so as to limit moisture from penetrating into the pixel array. The present invention also provides a corresponding method of manufacturing an organic light emitting display.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 4:
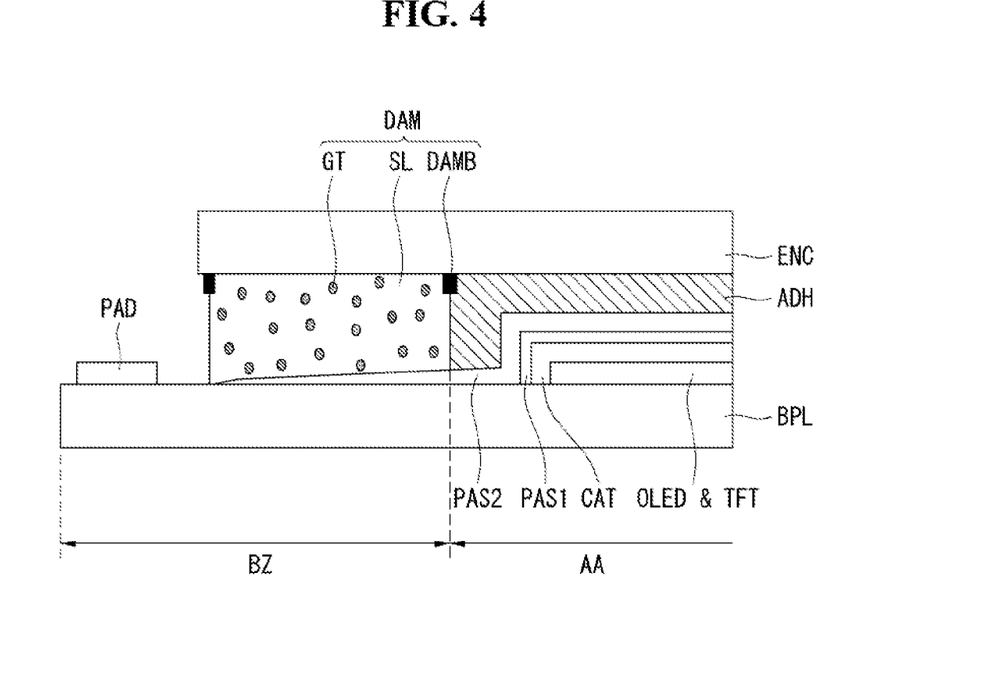
FIGS. 4 and 5 are cross-sectional views illustrating an organic light emitting display encapsulation technology according to an embodiment of the invention.
Figure 5:
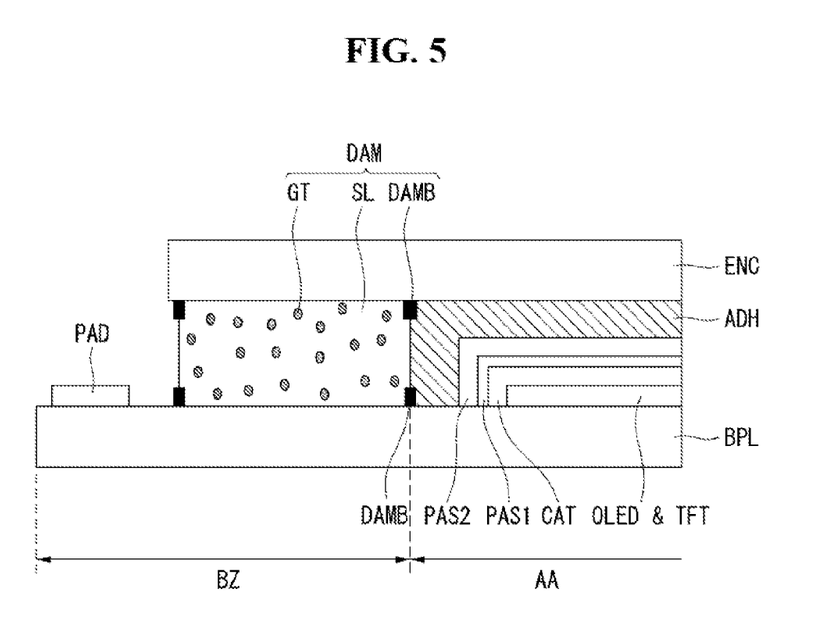

As shown in FIGS. 4 and 5, an organic light emitting display according to an embodiment of the invention includes a transparent adhesive film ADH for attaching a back plane BPL and an encapsulation plate ENC and a dam DAM formed at an edge of the back plane BPL.

Each of the back plane BPL and the encapsulation plate ENC may be manufactured using a glass substrate, a plastic substrate, or a metal substrate. In a top emission type organic light emitting display, the encapsulation plate is manufactured using a substrate formed of a transparent material. In a bottom emission type organic light emitting display, the back plane is manufactured using a substrate formed of a transparent material.

Further, the transparent adhesive film ADH is an adhesive film with a high transparency, and as shown in FIG. 4 does not include moisture absorption fillers. In more detail, the transparent adhesive film ADH includes a transparent base film and an adhesive applied to both surfaces of the transparent base film. A release film, is also attached to the adhesive. When the encapsulation plate ENC is attached to the back plane BPL, the adhesive applied to both surfaces of the transparent base film is exposed by removing the release film.

A method for attaching the encapsulation plate ENC to the back plane BPl, using the transparent adhesive film ADH forms a dam DAM. In more detail, the transparent adhesive film ADH can be formed on the encapsulation plate ENC and then the encapsulation plate ENC can be attached to the back plane BPL using a hot roll lamination method, a hot press method, or a vacuum press method, etc. when the encapsulation plate ENC is aligned on the back plane BPL with the dam DAM and the transparent adhesive film ADH interposed therebetween.

Further, the transparent adhesive film ADH attaches the encapsulation plate ENC to the back plane BPL in the active area AA. When the organic light emitting display according to the embodiment of the invention is configured as the top emission type organic light emitting display, a transmittance and an aperture ratio of the active area AA is increased because of the high transparency of the transparent adhesive film ADH.

As shown, the dam DAM is formed between the hack plane BPL and the encapsulation plate ENC at the edge of the back plane BPL, thereby enhancing an adhesive strength between the back plane BPL and the encapsulation plate ENC and thus blocking moisture. The dam DAM is also formed in the bezel area BZ outside the active area AA. The dam DAM includes a sealant SL and moisture absorption fillers GT distributed in the sealant SL. The sealant SL is a thermosetting and ultraviolet (UV) curable sealant. For example, the sealant SL may be an epoxy-based or acrylic-based sealant, to which a thermosetting accelerator and/or a photoinitiator are added. The sealant SL also attaches the back plane BPL to an edge of the encapsulation plate ENC and enhances an adhesive strength therebetween.

Further, the moisture absorption fillers GT are formed by grinding a material capable of absorbing moisture to form small size particles and uniformly distributing the particles in the sealant SL. The material of the moisture absorption fillers GT is not limited. For example, the moisture absorption fillers GT may be formed of alkali metal oxide, silica, porous zeolite, other organic moisture absorbents, or other inorganic moisture absorbents. A moisture reactive absorbent may use one or a mixture of at least two of a metal powder such as alumina, metal oxide, metal salt, or phosphorus pentoxide ($P_2O5$), etc.

A physical absorbent may use silica, zeolite, titania, zirconia, or montmorillonite, etc. In the embodiment disclosed herein, examples of the metal oxide may include lithium oxide ($Li_2O$), (sodium oxide ($Na_2O$), barium oxide (BaO), calcium oxide (CaO), or magnesium oxide (MgO). Examples of the metal salt may include sulfate such as $Li_2SO_4$, $Na_2SO_4$, $CaSO_4$, $MgSO_4$, $CoSO_4$, $Ga_2(SO_4)_3$, $Ti(SO_4)_2$ and $NiSO_4$, metal halide such as $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$ and $MgI_2$, and metal chlorate such as $Ba(ClO_4)_2$ and $Mg(ClO_4)_2$. Other metal salts may be used.

Figure 10:
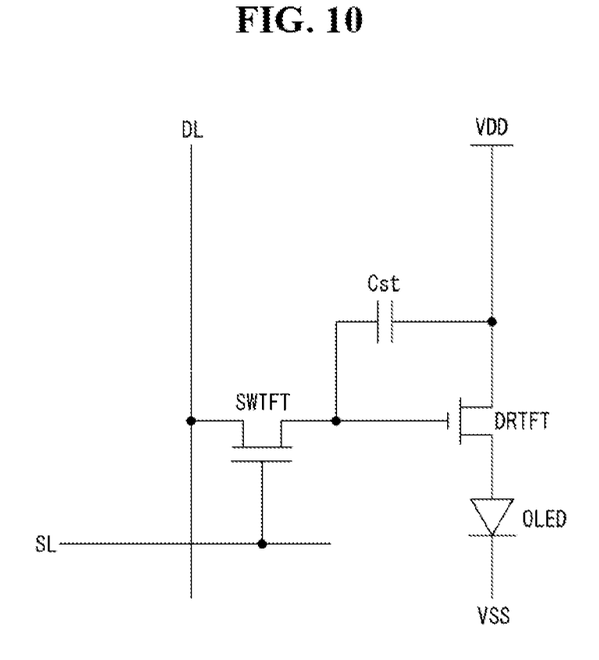
FIG. 10 is an equivalent circuit diagram of a pixel.

Further, the pixel array OLED & ITT is formed in the active area AA, on which the image is displayed. The pixel array OLED & TFT includes data lines, scan lines crossing the data lines, and pixels each including an OLED and a TFT. The pixels are also arranged in a matrix form. As shown in FIG. 10, each pixel included in the pixel array OLED & TFT includes a switching TFT SWTFT, a driving TFT DRTFT connected to the switching TFT SWTFT, an OLED connected to the driving TFT DRTFT, and a storage capacitor Cst. Each pixel may further include a compensation circuit for compensating for a threshold voltage and mobility.

In addition, one embodiment of the invention stacks first and second passivation layers PAS1 and PAS2 on the pixel array OLED & TFT, so as to reinforce a barrier covering the pixel array OLED & TFT. The first and second passivation layers PAS1 and PAS2 may be configured as a stack of homogeneous organic/inorganic insulating materials or heterogeneous organic/inorganic insulating materials. As shown in FIG. 4, the second passivation layer PAS2 is diffused to the bottom of the sealant SL. In FIG. 4, "PAD" denotes a data pad or a scan pad connected to an output terminal of a drive integrated circuit (IC) formed at an end of the data line or the scan line, and "CAT" denotes a cathode of the OLED.

As shown in FIG. 4, the dam DAM may further include a dam bank DAMB for defining an application area of the sealant SL. The dam bank DAMB may be diffused by a pressure generated when the encapsulation plate ENC is attached to the back plane BPL. Further, the dam bank DAMB is formed at a position contacting both edges of a drawing line of the sealant SL in at least one of the encapsulation plate ENC and the back plane BPL and limits the diffusion of the sealant SL.

In addition, a bank pattern may be formed inside the pixel array OLED & TFT of the back plane BPL to limit an area of the pixels. Color filters and black matrixes may be formed on the encapsulation plate ENC. The dam bank DAMB may be formed on the back plane BPL using the same material (for example, an acrylic-based resin) as the bank pattern formed on the back plane BPL. Further, the dam bank DAMB may be formed on the encapsulation plate ENC using the same material as the color filters and the black matrixes formed on the encapsulation plate ENC. The color filters and the black matrixes are formed of an acrylic-based resin, to which a pigment is added.

In another embodiment, as shown in FIG. 5, the dam bank DAME may be formed on the back plane BPL and the encapsulation plate ENC. When the sealant SL is diffused and meets the same structure as the dam bank DAMB, an adhesive angle increases due to surface tension. Hence, the sealant SL does not pass the dam bank DAMB. The height of the dam bank DAMB may be determined depending on a thickness of the bank pattern formed on the back plane BPL or a height of the color filter or the black matrix formed on the encapsulation plate ENC. Further, the surface of the dam bank DAMB may be implemented as a super repellent surface, so as to efficiently prevent the diffusion of the sealant SL. The super repellent surface of the dam bank DAMB may be implemented by adding a hydrophobic material to the dam bank DAMB or performing a hydrophobic process on the surface of the dam bank DAMB.

Figure 6:
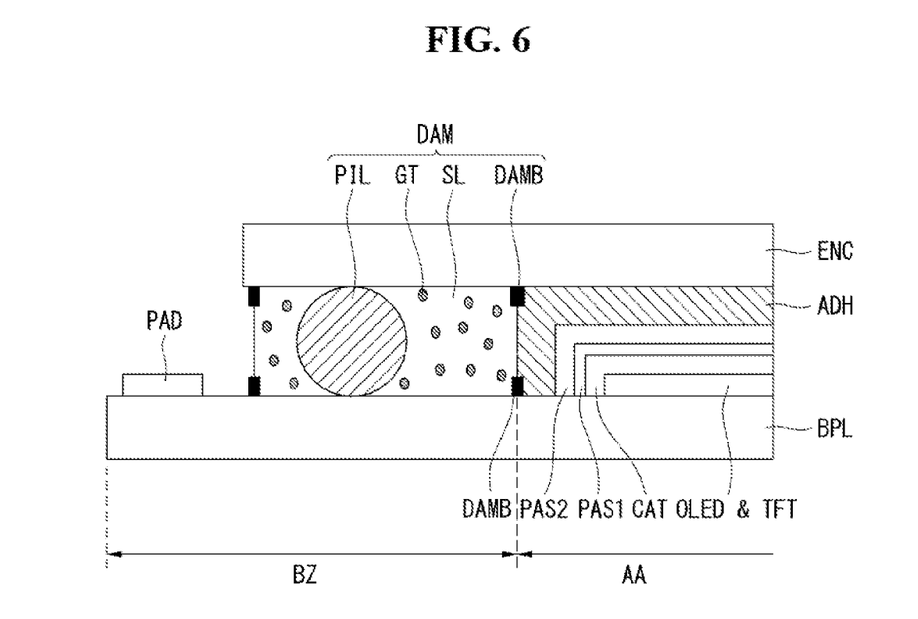
FIG. 6 is a cross-sectional view illustrating an organic light emitting display encapsulation technology according to another embodiment of the invention.

In still another embodiment, as shown in FIG. 6, the dam DAM may further include a pillar PIL. The material of the pillar PIL is not limited. For example, the pillar PIL may be formed of a glass fiber, a silicon dioxide ($SiO_2$) rod or powder, a carbon material, etc. The pillar PIL has the size larger than the moisture absorption filler GT and is distributed in the sealant SL. The pillar PIL thus limits the distance between the back plane BPL and the encapsulation plate ENC inside the dam DAM. Therefore, the pillar PIL prevents the dam DAM from breaking or being damaged because of the pressure generated when the encapsulation plate ENC is attached to the back plane BPL.

Figure 7:
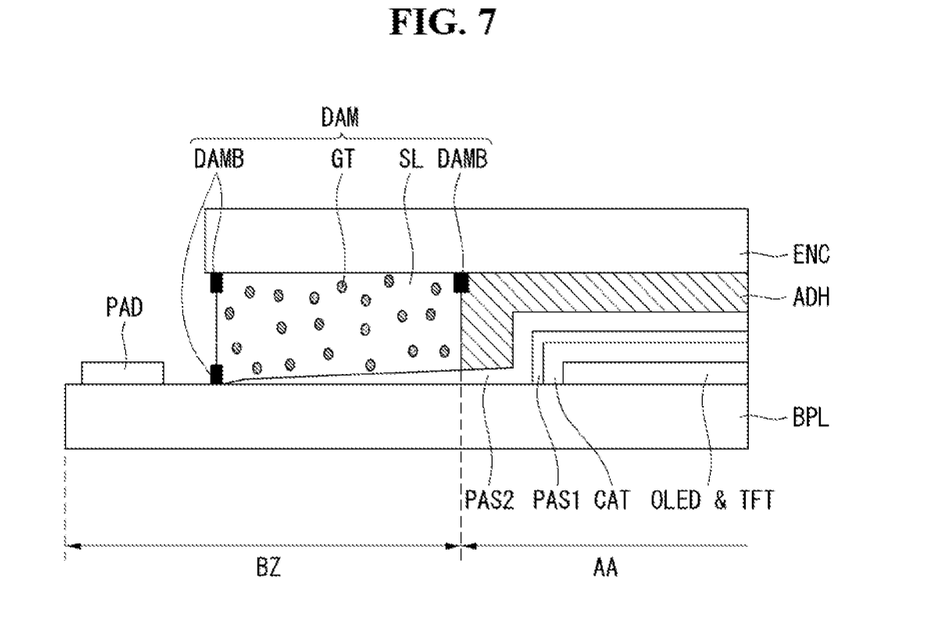
FIGS. 7 to 9 are cross-sectional views illustrating different patterns of a dam bank positioned around the inside of a sealant shown in FIGS. 4 to 6 according to an embodiment of the invention.
Figure 8:
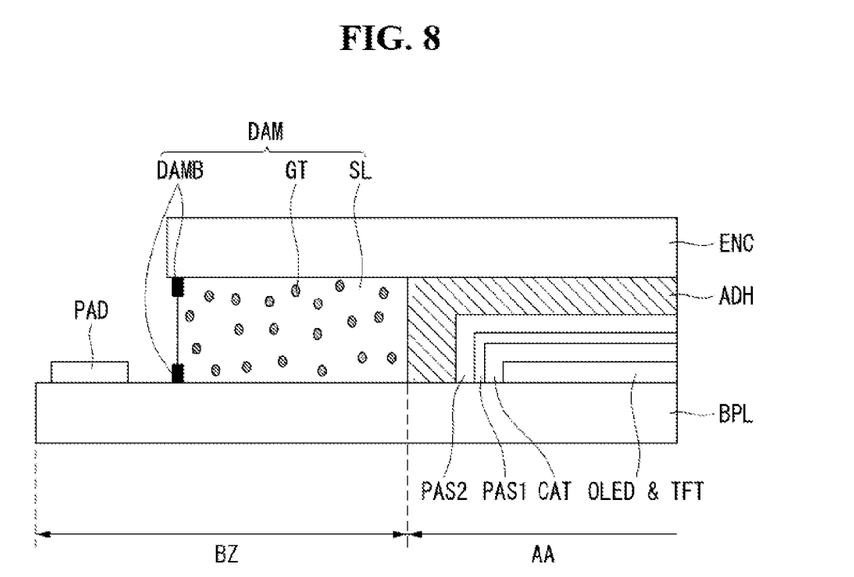
Figure 9:
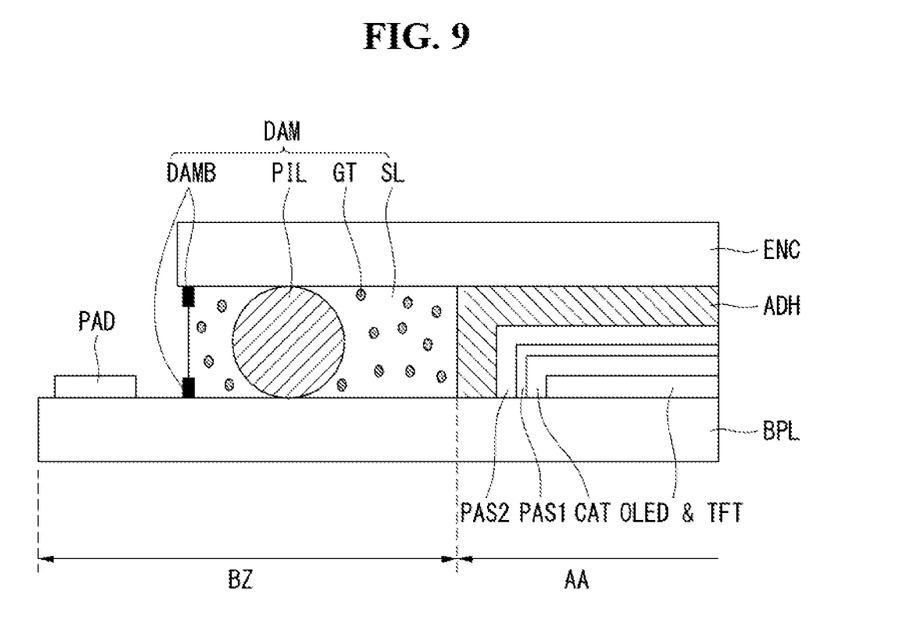

Next, FIGS. 7 to 9 are cross-sectional views showing different examples of dam bank patterns of the dam bank shown in FIGS. 4 to 6. In more detail, the dam bank DAMB is omitted on some sides of the sealant SL. That is, as shown in FIGS. 7 to 9, the dam bank DAMB may be formed in at least one of the encapsulation plate ENC and the back plane BPL and be omitted at an inner edge of the sealant SL. For example, as shown in FIG. 7, the dam bank DAMB is formed at positions contacting both edges of the sealant SL at the encapsulation plate ENC and is formed only at a position contacting an outer edge of the sealant SL at the back plane BPL.

In another example as shown in FIG. 8, the dam bank DAMB is formed at outer edges of the sealant SL at the encapsulation plate ENC and the back plane BPL and is not formed at the inner edges of the sealant SL at the encapsulation plate ENC and the back plane BPL. FIG. 9 illustrates the dam bank DMB formed only at outer edges of the sealant SL at the encapsulation plate ENC and the back plane BPL. FIG. 9 also illustrates the pillar PIL described above with respect to FIG. 6.

As described above, the embodiment of the invention attaches the encapsulation plate ENC to the back plane with the dam and the transparent adhesive film interposed therebetween. The dam blocks the moisture from penetrating into the side of the transparent adhesive film, thereby increasing the reliability and the lifespan of the organic light emitting display. Furthermore, the embodiment of the invention increases the transmittance and the aperture ratio of the active area by removing a moisture absorbent film from the transparent adhesive film.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display, comprising:
a back plane including an active area on which an image is displayed, and a bezel area outside the active area;
a pixel array on the active area and configured to display the image;
an encapsulation plate encapsulating the pixel array;
a transparent adhesive film free of moisture absorption fillers formed on the active area and disposed between the encapsulation plate and the back plane;
a dam including a sealant with moisture absorption fillers formed in the bezel area and adjoining the adhesive layer so as to limit moisture from penetrating into the pixel array; and
a first passivation layer disposed in both the active area and the bezel area,
wherein the sealant uniformly extends from an inner edge adjoining the adhesive layer to an outer edge of the sealant,
wherein the first passivation layer is disposed under the sealant within the bezel area and terminates before the outer edge of the sealant, wherein the first passivation layer is disposed between the pixel array and the encapsulation plate within the active area and contacts the back plane in both the active area and the bezel area,
wherein the moisture absorption fillers are in the form of small size particles and uniformly distributed in the sealant,
wherein the dam further includes at least two dam banks formed at positions contacting both edges of the sealant in the encapsulation plate and configured to limit a diffusion of the sealant, and one of the at least two dam banks is disposed directly between the sealant and the adhesive layer and between the first passivation layer and the encapsulation plate, and
wherein the one of the at least two dam banks does not contact the first passivation layer.

2. The organic light emitting display of claim 1, wherein the at least two dam banks are formed only at positions contacting both edges of the sealant in the encapsulation plate.

3. The organic light emitting display of claim 1, wherein the dam bank is formed at the positions contacting both edges of the sealant in the encapsulation plate and only at an outer edge of the sealant in the back plane.

4. The organic light emitting display of claim 1, wherein the dam bank is formed at the positions contacting both outer edges of the sealant in the encapsulation plate and the back plane.

5. The organic light emitting display of claim 1, wherein the dam further includes a pillar having a size larger than the moisture absorption filler.

6. The organic light emitting display of claim 5, wherein the pillar has a diameter corresponding to a distance between the encapsulation plate and the back plane.

7. The organic light emitting display of claim 1, wherein the first passivation layer and a second passivation layer cover the pixel array.

8. The organic light emitting display of claim 7, wherein the first and second passivation layers are configured as a stack of homogeneous organic/inorganic insulating materials or heterogeneous organic/inorganic insulating materials.

9. The organic light emitting display of claim 7, wherein the second passivation layer covers the pixel array and the first passivation layer is disposed on the second passivation layer.

10. The organic light emitting display of claim 9, wherein the second passivation layer is only disposed in the active area and the first passivation layer is disposed in both the active area and the bezel area.

11. The organic light emitting display of claim 10, wherein the first passivation layer is diffused to a bottom of the sealant.

12. The organic light emitting display of claim 1, further comprising a dam bank formed at the position contacting the inner edge of the sealant adjoining the active area and disposed at a position overlapping both the active area and the bezel area.

13. The organic light emitting display of claim 1, wherein the one of the at least two dam banks contacts only the sealant, the adhesive layer and the encapsulation plate.

14. The organic light emitting display of claim 1, wherein the back plane contacts the pixel array and the first passivation layer in the active area and the back plane contacts the first passivation layer in the bezel area.

* * * * *